United States Patent
Cheng et al.

(10) Patent No.: US 11,681,920 B2
(45) Date of Patent: Jun. 20, 2023

(54) METHOD AND APPARATUS FOR COMPRESSING DEEP LEARNING MODEL

(71) Applicant: Baidu USA LLC, Sunnyvale, CA (US)

(72) Inventors: Zhiyu Cheng, Sunnyvale, CA (US); Yingze Bao, Mountain View, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 812 days.

(21) Appl. No.: 16/585,772

(22) Filed: Sep. 27, 2019

(65) Prior Publication Data

US 2021/0097394 A1 Apr. 1, 2021

(51) Int. Cl.
*G06N 3/082* (2023.01)
*H03M 7/30* (2006.01)
*G06V 40/10* (2022.01)
*G06N 3/048* (2023.01)

(52) U.S. Cl.
CPC ............ *G06N 3/082* (2013.01); *G06N 3/048* (2023.01); *G06V 40/10* (2022.01); *H03M 7/702* (2013.01)

(58) Field of Classification Search
CPC combination set(s) only.
See application file for complete search history.

(56) References Cited

U.S. PATENT DOCUMENTS

| | | | | |
|---|---|---|---|---|
| 2019/0370656 A1* | 12/2019 | Xie | .................. | G06N 3/082 |
| 2019/0370658 A1* | 12/2019 | Xie | .................. | G06N 20/10 |
| 2020/0364572 A1* | 11/2020 | Senn | ................ | G06N 3/0454 |
| 2020/0364573 A1* | 11/2020 | Ramachandran | ..... | G06F 9/3455 |
| 2021/0073644 A1* | 3/2021 | Lin | ................ | G06N 3/04 |

FOREIGN PATENT DOCUMENTS

CN 110119745 * 8/2019 ........... G06K 9/6256

* cited by examiner

*Primary Examiner* — Zhiyu Lu
(74) *Attorney, Agent, or Firm* — Seed IP Law Group LLP

(57) ABSTRACT

Embodiments of the present disclosure disclose a method and apparatus for compressing a deep learning model. An embodiment of the method includes: acquiring a to-be-compressed deep learning model; pruning each layer of weights of the to-be-compressed deep learning model in units of channels to obtain a compressed deep learning model; and sending the compressed deep learning model to a terminal device, so that the terminal device stores the compressed deep learning model. By pruning each layer of weights of the deep learning model in units of channels, the parameter redundancy of the deep learning model is effectively reduced, thereby improving the computational speed of the deep learning model and maintaining the model accuracy.

12 Claims, 4 Drawing Sheets

METHOD AND APPARATUS FOR COMPRESSING DEEP LEARNING MODEL

TECHNICAL FIELD

Embodiments of the present disclosure relate to the field of computer technology, and specifically to a method and apparatus for compressing a deep learning model.

BACKGROUND

With the continuous development of artificial intelligence, application scenarios of deep learning models are increasingly extensive. For example, in a smart retail scenario or other similar scenario, a device on an intelligent terminal (a terminal device) counts the number of people in a designated region by detecting heads and shoulders of the people.

At present, the heads and shoulders are generally detected by the following two methods: first, a deep learning model for head and shoulder detection is run at a cloud, however, the running of the model at the cloud has the problems of high cost, large bandwidth pressure, poor privacy, etc.; second, a deep learning model for head and shoulder detection is run on a terminal device, however, the existing deep learning model for head and shoulder detection is too large and has the problem of low computational speed.

SUMMARY

Embodiments of the present disclosure provide a method and apparatus for compressing a deep learning model.

In a first aspect, an embodiment of the present disclosure provides a method for compressing a deep learning model, including: acquiring a to-be-compressed deep learning model; pruning each layer of weights of the to-be-compressed deep learning model in units of channels to obtain a compressed deep learning model; and sending the compressed deep learning model to a terminal device, so that the terminal device stores the compressed deep learning model.

In some embodiments, the pruning each layer of weights of the to-be-compressed deep learning model in units of channels includes: taking, for each layer of the to-be-compressed deep learning model, the layer of weights as a first preset number of filters; and pruning a second preset number of filters from the first preset number of filters, where the second preset number is smaller than the first preset number.

In some embodiments, the pruning a second preset number of filters from the first preset number of filters includes: calculating, for each layer of the to-be-compressed deep learning model, an L1-norm of each filter of the layer; and pruning the filters of which the L1 norms are smaller than a preset threshold from the layer.

In some embodiments, the pruning each layer of weights of the to-be-compressed deep learning model in units of channels includes: pruning the to-be-compressed deep learning model layer by layer, and retraining the to-be-compressed deep learning model by using a training sample set each time a layer is pruned.

In some embodiments, the pruning the to-be-compressed deep learning model layer by layer includes: first pruning, for each layer of the to-be-compressed deep learning model, convolutional weights of the layer before batch normalization, and then pruning batch normalization parameters of the layer.

In some embodiments, the deep learning model includes at least one of the following: a head and shoulder detection model, an object detection model, a human detection model, and a target detection model.

In some embodiments, the deep learning model is a head and shoulder detection model, and the terminal device performs head and shoulder detection by the following steps: acquiring an image of a preset region; and inputting the image to a compressed deep learning model to obtain head and shoulder detection boxes in the image.

In a second aspect, an embodiment of the present disclosure provides an apparatus for compressing a deep learning model, including: an acquisition unit, configured to acquire a to-be-compressed deep learning model; a pruning unit, configured to prune each layer of weights of the to-be-compressed deep learning model in units of channels to obtain a compressed deep learning model; and a sending unit, send the compressed deep learning model to a terminal device, so that the terminal device stores the compressed deep learning model.

In some embodiments, the pruning unit is further configured to: take, for each layer of the to-be-compressed deep learning model, the layer of weights as a first preset number of filters; and prune a second preset number of filters from the first preset number of filters, where the second preset number is smaller than the first preset number.

In some embodiments, the pruning unit is further configured to: calculate, for each layer of the to-be-compressed deep learning model, an L1-norm of each filter of the layer; and prune the filters of which the L1 norms are smaller than a preset threshold from the layer.

In some embodiments, the pruning unit is further configured to: prune the to-be-compressed deep learning model layer by layer, and retrain the to-be-compressed deep learning model by using a training sample set each time a layer is pruned.

In some embodiments, the pruning unit is further configured to: first prune, for each layer of the to-be-compressed deep learning model, convolutional weights of the layer before batch normalization, and then prune batch normalization parameters of the layer.

In some embodiments, the deep learning model includes at least one of the following: a head and shoulder detection model, an object detection model, a human detection model, and a target detection model.

In some embodiments, the deep learning model is a head and shoulder detection model, and the terminal device performs head and shoulder detection by the following steps: acquiring an image of a preset region; and inputting the image to a compressed deep learning model to obtain head and shoulder detection boxes in the image.

In a third aspect, an embodiment of the present disclosure provides an electronic device, including: one or more processors; and a storage apparatus storing one or more programs; where the one or more programs, when executed by the one or more processors, cause the one or more processors to implement the method described in any implementation manner of the first aspect.

In a fourth aspect, an embodiment of the present disclosure provides a computer-readable medium storing a computer program, where when the computer program is executed by a processor, the method as described in any implementation manner of the first aspect is implemented.

In a fifth aspect, an embodiment of the present disclosure provides another server, including: an interface; a memory storing one or more programs; and one or more processors operatively connected to the interface and the memory for:

acquiring a to-be-compressed deep learning model; pruning each layer of weights of the to-be-compressed deep learning model in units of channels to obtain a compressed deep learning model; and sending the compressed deep learning model to a terminal device, so that the terminal device stores the compressed deep learning model.

In a sixth aspect, an embodiment of the present disclosure provides a computer-readable storage medium storing a computer program, where the computer program, when executed by one or more processors, causes the one or more processors to: acquire a to-be-compressed deep learning model; prune each layer of weights of the to-be-compressed deep learning model in units of channels to obtain a compressed deep learning model; and send the compressed deep learning model to a terminal device, so that the terminal device stores the compressed deep learning model.

According to the method and apparatus for compressing a deep learning model provided by the embodiments of the present disclosure, a to-be-compressed deep learning model is first acquired; then, each layer of weights of the to-be-compressed deep learning model is pruned in units of channels to obtain a compressed deep learning model; and finally, the compressed deep learning model is sent to a terminal device, so that the terminal device stores the compressed deep learning model. By pruning each layer of weights of the deep learning model in units of channels, the parameter redundancy of the deep learning model is effectively reduced. At the same time, by sending the compressed deep learning model to the terminal device for storage, the storage space occupied by the model is reduced. In addition, by running the compressed deep learning model on the terminal device, the communication bandwidth is reduced, and the computational amount of the deep learning model is lowered, thereby improving the computational speed of the deep learning model.

BRIEF DESCRIPTION OF THE DRAWINGS

After reading detailed descriptions of non-limiting embodiments with reference to the following accompanying drawings, other features, objectives and advantages of the present disclosure will become more apparent.

DETAILED DESCRIPTION OF EMBODIMENTS

Figure 1:
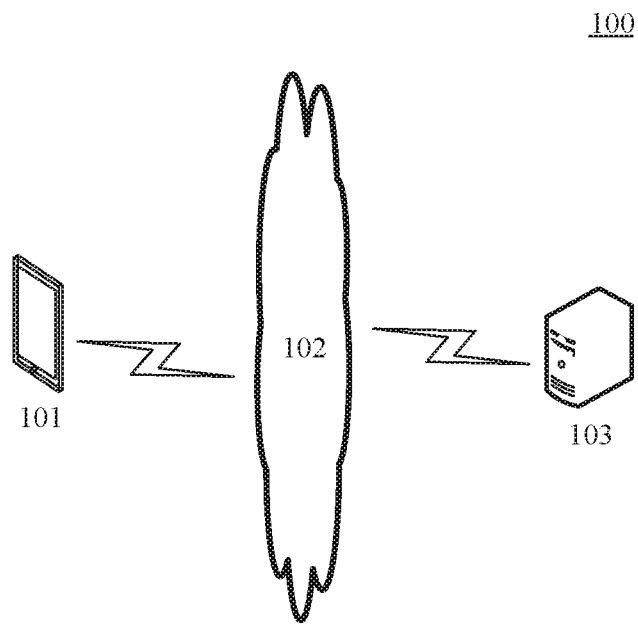
FIG. 1 is an illustrative system architecture to which the present disclosure may be applied.

The present disclosure will be further described below in detail in combination with the accompanying drawings and the embodiments. It could be appreciated that the specific embodiments described herein are only used to interpret a relevant disclosure rather than to define the disclosure. It should be noted that, for the sake of description, only parts related to the relevant disclosure are shown in the drawings.

It should also be noted that the embodiments in the present disclosure and features in the embodiments can be combined with each other without conflicts. The present disclosure will be described in detail with reference to the accompanying drawings and embodiments.

FIG. 1 shows an exemplary system architecture 100 to which an embodiment of a method for compressing a deep learning model or an apparatus for compressing a deep learning model according to the present disclosure may be applied.

As shown in FIG. 1, the system architecture 100 may include a terminal device 101, a network 102, and a server 103. The network 102 serves as a medium providing a communication link between the terminal device 101 and the server 103. The network 102 may include various types of connections, such as wired or wireless communication links, or optical fiber cables.

A user may interact with the server 103 by using the terminal device 101 through the network 102 to receive or send messages, etc. Various communication client applications, e.g., human detection applications, human tracking applications, people counting applications, etc., may be installed in the terminal device 101.

The terminal device 101 may be hardware or software. When the terminal device 101 is hardware, the terminal device 101 may be various electronic devices having an image acquisition function, including but not limited to a camera, a smart phone, a tablet computer, a laptop computer, a desktop computer, etc. When the terminal device 101 is software, the terminal device 101 may be installed in the electronic devices. The terminal device 101 may be implemented as a plurality of software programs or software modules, or as a single software program or software module. Specific limitations are not provided here.

The server 103 may provide various services. For example, the server 103 may analyze the acquired data such as a to-be-compressed deep learning model, and send the processing result (for example, the compressed deep learning model) to the terminal device 101.

It should be noted that the server 103 may be hardware or software. When the server 103 is hardware, the server 103 may be implemented as a distributed server cluster composed of multiple servers, or as a single server. When the server 103 is software, the server 103 may be implemented as a plurality of software programs or software modules (e.g., for providing distributed services), or as a single software program or software module. Specific limitations are not provided here.

It should be understood that the numbers of the terminal device, the network and the server in FIG. 1 are merely illustrative. Any number of terminal devices, networks and servers may be provided based on actual requirements.

Figure 2:
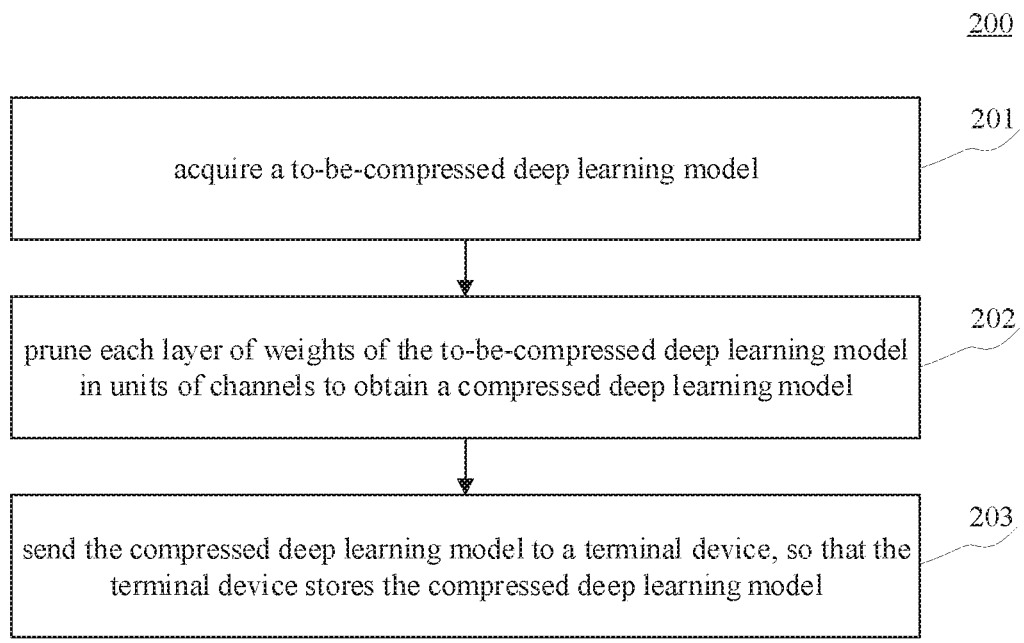
FIG. 2 is a flowchart of an embodiment of a method for compressing a deep learning model according to the present disclosure.

Further referring to FIG. 2, a flow 200 of an embodiment of a method for compressing a deep learning model according to the present disclosure is shown. The method for compressing a deep learning model includes the following steps:

Step 201: acquiring a to-be-compressed deep learning model.

In the present embodiment, the executing body (for example, the server 103 shown in FIG. 1) of the method for compressing a deep learning model may acquire the to-be-compressed deep learning model from a terminal device (for example, the terminal device 101 shown in FIG. 1) in communication connection thereto. Of course, if the to-becompressed deep learning model is pre-stored locally in the executing body, the executing body may also locally acquire the to-be-compressed deep learning model.

It should be noted that the to-be-compressed deep learning model may be a deep learning model trained by using a training sample set in advance, and the computational precision thereof has satisfied the requirement. Generally, in order to ensure the computational precision, the to-be-compressed deep learning model is large. If the to-be-compressed deep learning model is directly stored on the terminal device, a large storage space is occupied. Moreover, if the to-be-compressed deep learning model is directly run on the terminal device, the computational speed is low, and cannot meet the computational requirement of an actual application scenario.

In addition, the to-be-compressed deep learning model includes a plurality of convolutional layers, and may be, for example, a Convolutional Neural Network (CNN). Each convolutional layer of the to-be-compressed deep learning model may have a corresponding layer number, so the convolutional layers may be, for example, named as conv0, conv1, conv14_1, conv14_2, and the like.

Step 202: pruning each layer of weights of the to-be-compressed deep learning model in units of channels to obtain a compressed deep learning model.

In the present embodiment, the executing body may prune each layer of weights of the to-be-compressed deep learning model in units of channels to obtain a compressed deep learning model. Specifically, the executing body may judge the importance of parameters in each layer of weights by using an effective judgment means, and prune unimportant parameters to reduce the parameter redundancy of the deep learning model.

In some optional implementation manners of the present embodiment, for each layer of the to-be-compressed deep learning model, the executing body may first take the layer of weights as a first preset number of filters, and then prune a second preset number of filters from the first preset number of filters. The second preset number is smaller than the first preset number. Specifically, each layer of weights of the to-be-compressed deep learning model is four-dimensional. The four-dimensional weights are a series of values, and may be regarded as a four-dimensional array of N×C×H×W. N is the number of channels, may also represent the number of filters, and is equal to the first preset number. Each filter may consist of a three-dimensional array C×H×W, where C represents a length, H represents a height, and W represents a width. Hence, each filter may be regarded as a three-dimensional cube. Each layer of weights consists of N filters, where M filters need to be pruned from the N filters. The value of M is equal to the second preset number. The pruned M filters may be unimportant parameters in the layer of weights.

Step 203: sending the compressed deep learning model to a terminal device, so that the terminal device stores the compressed deep learning model.

In the present embodiment, the executing body may send the compressed deep learning model to the terminal device. In this way, the terminal device can store the compressed deep learning model. By compressing the deep learning model, the parameter redundancy of the deep learning model is effectively reduced. At the same time, the compressed deep learning model is sent to the terminal device for storage, which reduces the storage space occupied by the model.

In some optional implementation manners of the present embodiment, the deep learning model may include, but is not limited to, at least one of the following: a head and shoulder detection model, an object detection model, a human detection model, a target detection model, etc. Here, the deep learning model is mainly responsible for a detection task, and a tracking task and a counting task may also be performed subsequently based on a detection box output by the deep learning model.

In some optional implementation manners of the present embodiment, the deep learning model is exemplified by a head and shoulder detection model, and the terminal device may perform head and shoulder detection through the following steps:

First, an image of a preset region is acquired.

Generally, if applied in a smart retail scenario, the preset region may be a designated region in an unmanned supermarket. The terminal device may be installed in the vicinity of the designated region, and a camera thereof faces the designated region for acquiring an image of the designated region.

Then, the image is input to a compressed deep learning model to obtain head and shoulder detection boxes in the image.

Here, the executing body may run the compressed deep learning model to perform head and shoulder detection on the image, and output the head and shoulder detection boxes in the image. By running the compressed deep learning model on the terminal device, the communication bandwidth is reduced, and the computational amount of the deep learning model is lowered, thereby improving the computational speed of the deep learning model.

Finally, based on the head and shoulder detection boxes in the image, human bodies in the preset region are tracked and counted.

In practice, because the deep learning model is large, the method for compressing the deep learning model is usually applied to a device with strong computing power such as a cloud or a host server. Of course, in the case where the deep learning model is not particularly large or the terminal device has strong enough computing power, the method for compressing the deep learning model may also be applied to a device such as a roadside computing unit.

According to the method for compressing a deep learning model provided by the embodiment of the present disclosure, a to-be-compressed deep learning model is first acquired; then, each layer of weights of the to-be-compressed deep learning model is pruned in units of channels to obtain a compressed deep learning model; and finally, the compressed deep learning model is sent to a terminal device, so that the terminal device stores the compressed deep learning model. By pruning each layer of weights of the deep learning model in units of channels, the parameter redundancy of the deep learning model is effectively reduced. At the same time, by sending the compressed deep learning model to the terminal device for storage, the storage space occupied by the model is reduced. In addition, by running the compressed deep learning model on the terminal device, the communication bandwidth is reduced, and the computational amount of the deep learning model is lowered, thereby improving the computational speed of the deep learning model.

Figure 3:
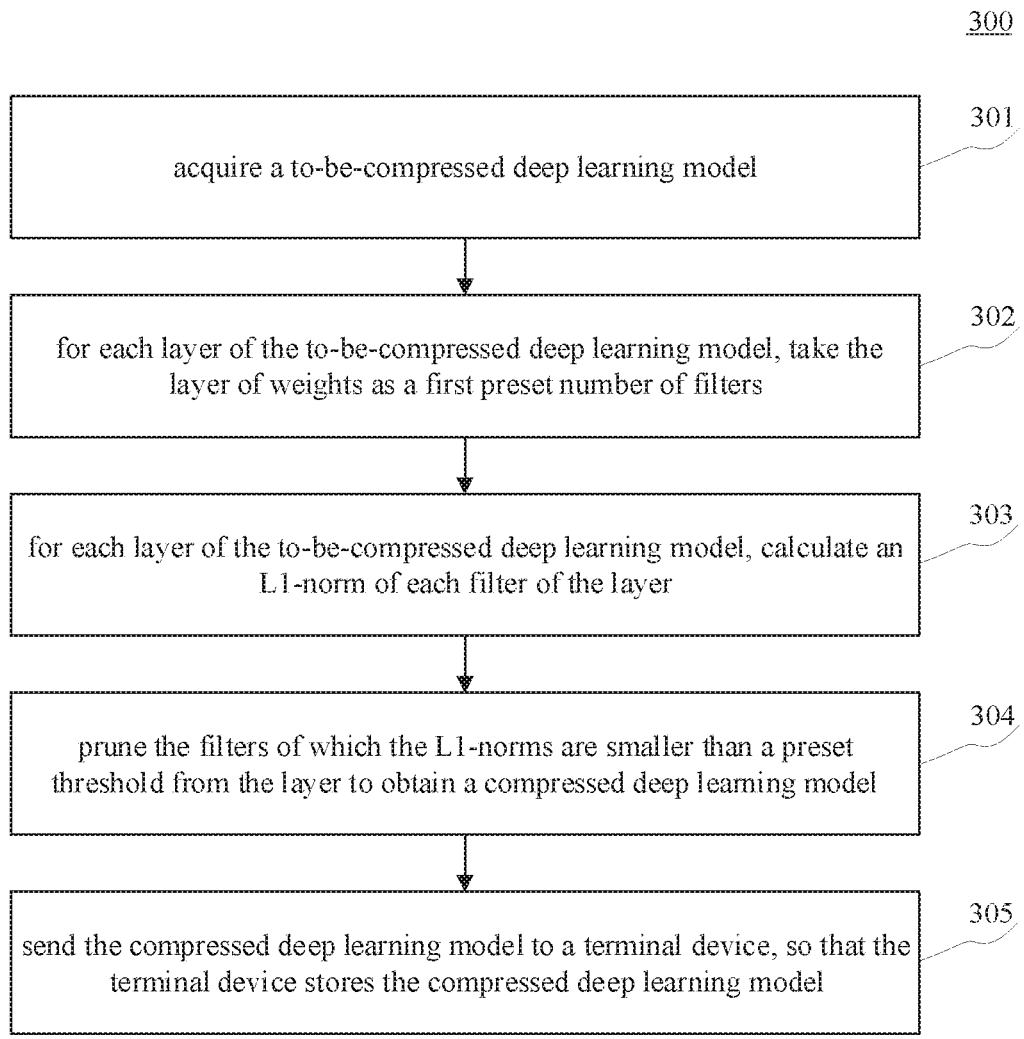
FIG. 3 is a flowchart of another embodiment of a method for compressing a deep learning model according to the present disclosure.

Further referring to FIG. 3, a flow 300 of another embodiment of a method for compressing a deep learning model according to the present disclosure is shown. The method for compressing a deep learning model includes the following steps:

Step 301: acquiring a to-be-compressed deep learning model.

In the present embodiment, the specific operation of step 301 has been described in detail in step 201 of the embodiment shown in FIG. 2, and details are not described herein again.

Step 302: for each layer of the to-be-compressed deep learning model, taking the layer of weights as a first preset number of filters.

In the present embodiment, for each layer of the to-be-compressed deep learning model, the executing body (for example, the server 103 shown in FIG. 1) of the method for compressing a deep learning model may take the layer of weights as the first preset number of filters.

Specifically, each layer of weights of the to-be-compressed deep learning model is four-dimensional. The four-dimensional weights are a series of values, and may be regarded as a four-dimensional array of N×C×H×W. N is the number of channels, may also represent the number of filters, and is equal to the first preset number. Each layer of weights consists of N filters. Each filter may consist of a three-dimensional array C×H×W, where C represents a length, H represents a height, and W represents a width. Hence, each filter may be regarded as a three-dimensional cube.

Step 303: for each layer of the to-be-compressed deep learning model, calculating an L1-norm of each filter of the layer.

In the present embodiment, for each layer of the to-be-compressed deep learning model, the executing body may calculate the L1-norm of each filter of the layer. The L1-norm indicates a sum of absolute values of elements in a vector, and is also referred to as "Lasso regularization".

Step 304: pruning the filters of which the L1-norms are smaller than a preset threshold from the layer to obtain a compressed deep learning model.

In the present embodiment, the executing body may prune the filters of which the L1-norms are smaller than the preset threshold from the layer to obtain a compressed deep learning model. That is to say, the executing body prunes each layer of weights of the deep learning model based on the L1-norms as a pruning criterion.

In practice, we perform a statistical analysis of the distribution of weights of convolutional layers in a deep learning model, found that the L1-norms of about 30% of filters in each convolutional layer are relatively small (less than 0.4). Therefore, for each convolutional layer in the deep learning model, about 30% of filters can be pruned.

Step 305: sending the compressed deep learning model to a terminal device, so that the terminal device stores the compressed deep learning model.

In the present embodiment, the specific operation of step 305 has been described in detail in step 203 of the embodiment shown in FIG. 2, and details are not described herein again.

It can be seen from FIG. 3 that, compared with the corresponding embodiment of FIG. 2, the flow 300 of the method for compressing a deep learning model in the present embodiment highlights the step of pruning each layer of weights of the deep learning model. Accordingly, the scheme described in the present embodiment improves the pruning accuracy and pruning efficiency by pruning each layer of weights of the deep learning model based on the L1-norms as a pruning criterion.

Figure 4:
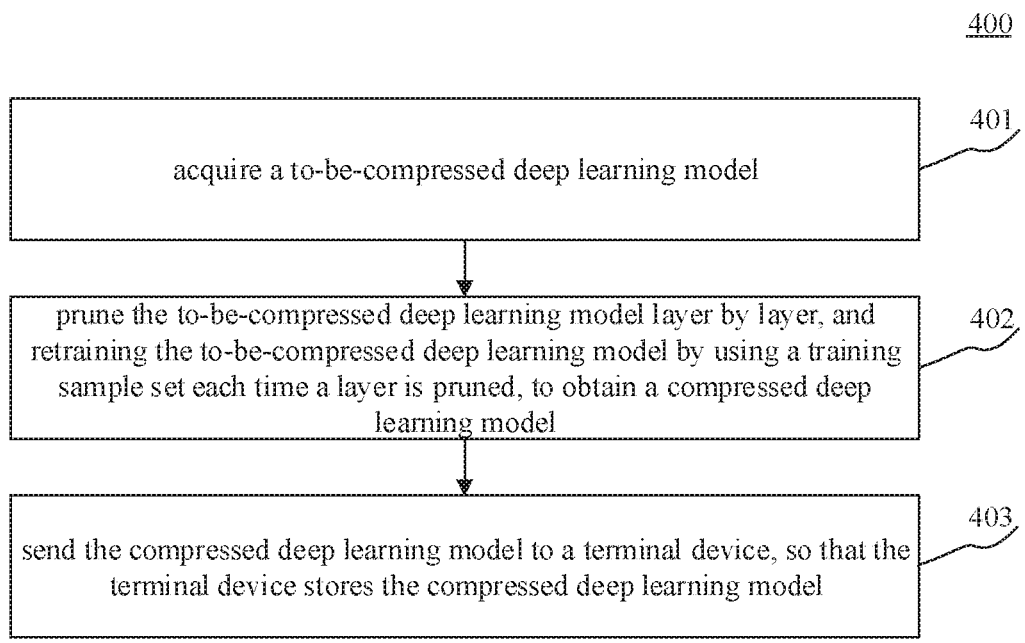
FIG. 4 is a flowchart of another embodiment of a method for compressing a deep learning model according to the present disclosure.

Further referring to FIG. 4, a flow 400 of another embodiment of a method for compressing a deep learning model according to the present disclosure is shown. The method for compressing a deep learning model includes the following steps:

Step 401: acquiring a to-be-compressed deep learning model.

In the present embodiment, the specific operation of step 401 has been described in detail in step 201 of the embodiment shown in FIG. 2, and details are not described herein again.

Step 402: pruning the to-be-compressed deep learning model layer by layer, and retraining the to-be-compressed deep learning model by using a training sample set each time a layer is pruned, to obtain a compressed deep learning model.

In the present embodiment, the executing body may prune the to-be-compressed deep learning model layer by layer, and retrain the to-be-compressed deep learning model by using the training sample set each time a layer is pruned, to obtain a compressed deep learning model.

Generally, the to-be-compressed deep learning model may be a deep learning model trained by using the training sample set in advance, and the computational precision thereof has satisfied the requirement. After a layer of weights of the to-be-compressed deep learning model is pruned, the computational precision of the pruned deep learning model may decrease due to the reduction of parameters of the layer. Here, each time a layer is pruned, the to-be-compressed deep learning model is retrained using the training sample set. In this way, the computational precision of the to-be-compressed deep learning model can be restored as much as possible, so that the computational precision is substantially not lost when the parameters are reduced.

In some optional implementation manners of the present embodiment, for each layer of the to-be-compressed deep learning model, the executing body may first prune convolutional weights of the layer before batch normalization, and then prune the batch normalization parameters of the layer. Specifically, the pruning of filters of the layer is the pruning of convolutional weights of the layer. Because each filter has corresponding batch normalization parameters, after the filters are pruned, the corresponding batch normalization parameters also need to be pruned.

Step 403: sending the compressed deep learning model to a terminal device, so that the terminal device stores the compressed deep learning model.

In the present embodiment, the specific operation of step 403 has been described in detail in step 203 of the embodiment shown in FIG. 2, and details are not described herein again.

It can be seen from FIG. 4 that, compared with the corresponding embodiment of FIG. 2, the flow 400 of the method for compressing a deep learning model in the present embodiment adds a step of retraining the to-be-compressed deep learning model in the pruning process. Thus, in the scheme described in the present embodiment, each time a layer is pruned, the to-be-compressed deep learning model is retrained using the training sample set. In this way, the computational precision of the to-be-compressed deep learning model can be restored as much as possible, so that the computational precision is substantially not lost when the parameters are reduced.

Figure 5:
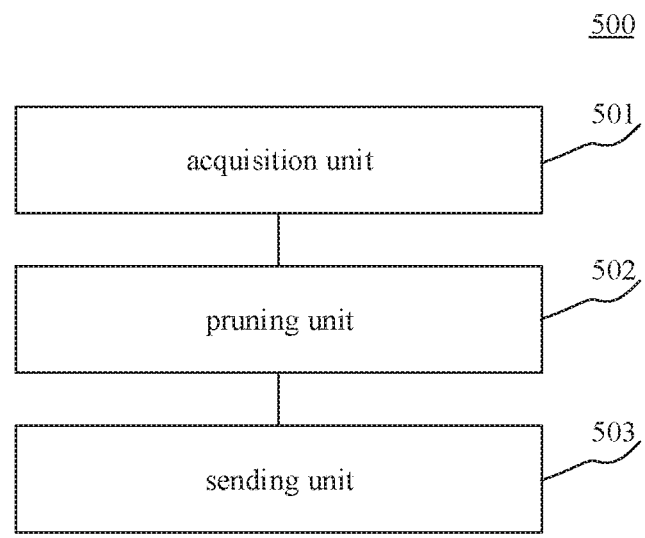
FIG. 5 is a schematic structural diagram of an embodiment of an apparatus for compressing a deep learning model according to the present disclosure.

Further referring to FIG. 5, as an implementation of the method shown in the above figures, the present disclosure provides an embodiment of an apparatus for compressing a deep learning model, the embodiment of the apparatus corresponds to the embodiment of the method shown in FIG. 2, and the apparatus specifically can be applied to various electronic devices.

As shown in FIG. 5, the apparatus 500 for compressing a deep learning model according to the present embodiment may include an acquisition unit 501, a pruning unit 502, and a sending unit 503. The acquisition unit 501 is configured to acquire a to-be-compressed deep learning model; the pruning unit 502 is configured to prune each layer of weights of the to-be-compressed deep learning model in units of channels to obtain a compressed deep learning model; and the sending unit 503 configured to send the compressed deep learning model to a terminal device, so that the terminal device stores the compressed deep learning model.

In the present embodiment, the specific processing of the acquisition unit 501, the pruning unit 502, and the sending unit 503 of the apparatus 500 for compressing a deep learning model and the technical effects thereof may be referred to the related description in steps 201-203 in the corresponding embodiment of FIG. 2, respectively, and details are not described herein again.

In some optional implementation manners of the present embodiment, the pruning unit 502 is further configured to: take, for each layer of the to-be-compressed deep learning model, the layer of weights as a first preset number of filters; and prune a second preset number of filters from the first preset number of filters, where the second preset number is smaller than the first preset number.

In some optional implementation manners of the present embodiment, the pruning unit 502 is further configured to: calculate, for each layer of the to-be-compressed deep learning model, an L1-norm of each filter of the layer; and prune the filters of which the L1 norms are smaller than a preset threshold from the layer.

In some optional implementation manners of the present embodiment, the pruning unit 502 is further configured to: prune the to-be-compressed deep learning model layer by layer, and retrain the to-be-compressed deep learning model by using a training sample set each time a layer is pruned.

In some optional implementation manners of the present embodiment, the pruning unit 502 is further configured to: first prune, for each layer of the to-be-compressed deep learning model, convolutional weights of the layer before batch normalization, and then prune batch normalization parameters of the layer.

In some optional implementation manners of the present embodiment, the deep learning model includes at least one of the following: a head and shoulder detection model, an object detection model, a human detection model, and a target detection model.

In some optional implementation manners of the present embodiment, the deep learning model is a head and shoulder detection model, and the terminal device performs head and shoulder detection by the following steps: acquiring an image of a preset region; and inputting the image to a compressed deep learning model to obtain head and shoulder detection boxes in the image.

Hereinafter, referring to FIG. 6, a schematic structural diagram of a computer system 600 adapted to implement an electronic device (for example, the server 103 shown in FIG. 1) of the embodiments of the present disclosure is shown. The electronic device shown in FIG. 6 is just an example, which does not impose any restrictions on the functions and scope of application of the present embodiments of the present disclosure.

Figure 6:
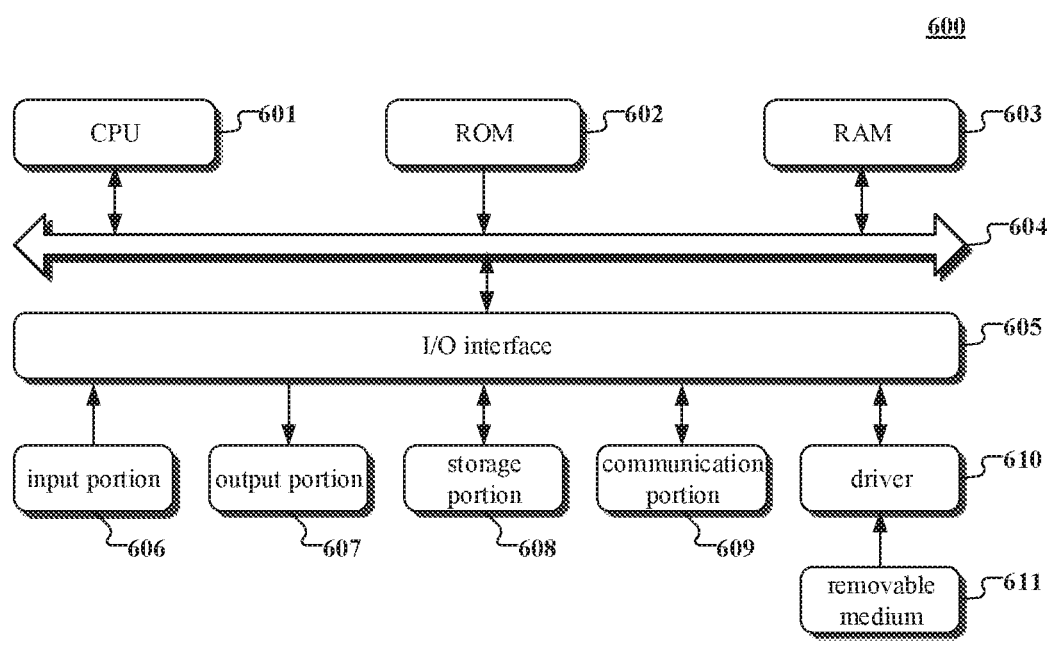
FIG. 6 is a schematic structural diagram of a computer system adapted to implement an electronic device of the embodiments of the present disclosure.

As shown in FIG. 6, the computer system 600 includes a central processing unit (CPU) 601, which can execute various appropriate operations and processes based on programs stored in a read-only memory (ROM) 602 or programs loaded from a storage portion 608 to a random access memory (RAM) 603. Various programs and data required by the operations of the system 600 are also stored in the RAM 603. The CPU 601, the ROM 602, and the RAM 603 are connected to each other by a bus 604. An input/output (I/O) interface 605 is also connected to the bus 604.

The following components are connected to the I/O interface 605: an input portion 606 including a keyboard, a mouse, etc.; an output portion 607 including a cathode ray tube (CRT), a liquid crystal display (LCD), a speaker, etc.; a storage portion 608 including a hard disk, etc.; and a communication portion 609 including a network interface card, such as an LAN card and a modem. The communication portion 609 performs communication processes via a network, such as the Internet. A driver 610 is also connected to the I/O interface 605 as needed. A removable medium 611 such as a magnetic disk, an optical disk, a magneto-optical disk or a semiconductor memory is installed on the driver 610 as needed, so that a computer program read therefrom is installed in the storage portion 608 as needed.

Particularly, according to the embodiments of the present disclosure, the process described above by referring to the flowchart can be implemented as a computer software program. For example, an embodiment of the present disclosure provides a computer program product including a computer program loaded to a computer-readable medium, the computer program including a program code for executing the method shown in the flowchart. In such an embodiment, the computer program may be downloaded and installed from a network via the communication portion 609, and/or installed from the removable medium 611. When the computer program is executed by the CPU 601, the functions defined in the method of the embodiments of the present disclosure are executed.

It should be noted that the computer-readable medium of the present disclosure may be a computer-readable signal medium or a computer-readable storage medium or a combination of the two. An example of the computer-readable storage medium may be, but is not limited to: electric, magnetic, optical, electromagnetic, infrared, or semiconductor systems, apparatuses, elements, or any combination of the above. A more specific example of the computer-readable storage medium may include but is not limited to: an electrical connection with one or more wires, a portable computer disk, a hard disk, a random access memory (RAM), a read only memory (ROM), an erasable programmable read only memory (EPROM or flash memory), a fiber, a portable compact disk read only memory (CD-ROM), an optical memory, a magnet memory, or any suitable combination of the above. In the present disclosure, the computer-readable storage medium may be any tangible medium containing or storing programs which may be used by an instruction execution system, apparatus or device or incorporated thereto. In the present disclosure, the computer-readable signal medium may include data signals in a baseband or propagated as parts of carriers, in which computer-readable program codes are carried. The data signals propagated may be in multiple forms, including but not limited to electromagnetic signals, optical signals or any appropriate combination of them. The computer-readable signal medium may also be any computer-readable medium beyond the computer-readable storage medium. The computer-readable medium is capable of sending, propagating or transmitting a program used by an instruction execution system, apparatus or device or a combination of them. The program codes included in the computer-readable medium may be transmitted by any appropriate medium, including but not limited to wireless, wired, optical cable, RF, etc., or any appropriate combination of them.

Computer program codes for executing the operations in the embodiments of the present disclosure may be compiled using one or more programming languages or combinations thereof. The programming languages include object-oriented programming languages, such as Java, Smalltalk, and C++, and also include conventional procedural programming languages, such as "C" language or similar programming languages. The program codes may be completely executed on a user's computer, partially executed on a user's computer, executed as a separate software package, partially executed on a user's computer and partially executed on a remote computer, or completely executed on a remote computer or an electronic device. In the circumstance involving a remote computer, the remote computer may be connected to a user's computer through any network, including a local area network (LAN) or a wide area network (WAN), or connected to an external computer (for example, connected through Internet using an Internet service provider).

The process diagrams and block diagrams in the drawings illustrate system architectures, functions and operations that may be implemented according to the systems, methods and computer program products of various embodiments of the present disclosure. In this regard, each box in the flowcharts or block diagrams may represent a module, a program segment, or a part of a code, which includes one or more executable instructions for implementing the specified logical functions. It should be noted that, in some alternative implementations, the functions marked in the boxes may also be implemented in an order different from that marked in the drawing. For example, two consecutive boxes substantially may be executed in parallel, or sometimes executed in a reverse order, depending on the involved functions. It should also be noted that, each box in the block diagrams and/or flowcharts, and a combination of boxes in the block diagrams and/or flowcharts may be implemented by a dedicated hardware-based system for executing specified functions or operations, or implemented by a combination of dedicated hardware and computer instructions.

The units described in the embodiments of the present disclosure may be implemented by software or hardware. The described units may also be provided in a processor, for example, described as: a processor, including an acquisition unit, a pruning unit, and a sending unit. The names of these units do not in some cases constitute a limitation to such units themselves. For example, the acquisition unit may also be described as "a unit for acquiring a to-be-compressed deep learning model."

In another aspect, the present disclosure further provides a computer-readable medium. The computer-readable medium may be included in the electronic device described in the above described embodiments, or a stand-alone computer-readable medium not assembled into the electronic device. The computer-readable medium stores one or more programs. The one or more programs, when executed by the electronic device, cause the electronic device to: acquire a to-be-compressed deep learning model; prune each layer of weights of the to-be-compressed deep learning model in units of channels to obtain a compressed deep learning model; and send the compressed deep learning model to a terminal device, so that the terminal device stores the compressed deep learning model.

In still another aspect, an embodiment of the present disclosure provides another server, including: an interface; a memory storing one or more programs; and one or more processors operatively connected to the interface and the memory for: acquiring a to-be-compressed deep learning model; pruning each layer of weights of the to-be-compressed deep learning model in units of channels to obtain a compressed deep learning model; and sending the compressed deep learning model to a terminal device, so that the terminal device stores the compressed deep learning model.

In still another aspect, an embodiment of the present disclosure provides a computer-readable storage medium storing a computer program, where the computer program, when executed by one or more processors, causes the one or more processors to: acquire a to-be-compressed deep learning model; prune each layer of weights of the to-be-compressed deep learning model in units of channels to obtain a compressed deep learning model; and send the compressed deep learning model to a terminal device, so that the terminal device stores the compressed deep learning model.

The above description only provides an explanation of the preferred embodiments of the present disclosure and the technical principles used. It should be appreciated by those skilled in the art that the inventive scope of the present disclosure is not limited to the technical solutions formed by the particular combinations of the above-described technical features. The inventive scope should also cover other technical solutions formed by any combinations of the above-described technical features or equivalent features thereof without departing from the concept of the disclosure. Technical solutions formed by the above-described features being interchanged with, but not limited to, technical features with similar functions disclosed in the present disclosure are examples.

What is claimed is:

1. A method for compressing a deep learning model, comprising:
   acquiring a to-be-compressed deep learning model;
   pruning each layer of weights of the to-be-compressed deep learning model in units of channels to obtain a compressed deep learning model; and
   sending the compressed deep learning model to a terminal device, so that the terminal device stores the compressed deep learning model,
   wherein the pruning each layer of weights of the to-be-compressed deep learning model in units of channels comprises:
   taking, for each layer of the to-be-compressed deep learning model, the layer of weights, represented by a four-dimensional array, as a first preset number of filters, the first preset number being a value of a dimension of the four-dimensional array and a filter being a three-dimensional array obtained by removing the dimension for the first preset number from the four-dimensional array; and
   pruning a second preset number of filters from the first preset number of filters according to an importance of each filter, wherein the second preset number is smaller than the first preset number,
   wherein the pruning each layer of weights of the to-be-compressed deep learning model in units of channels comprises:
   first pruning, for each layer of the to-be-compressed deep learning model, convolutional weights of the layer before batch normalization, and then pruning batch normalization parameters, corresponding to the second preset number of filters, of the layer; and
   retraining the to-be-compressed deep learning model by using a training sample set each time a layer is pruned.

2. The method according to claim 1, wherein the pruning a second preset number of filters from the first preset number of filters comprises:

calculating, for each layer of the to-be-compressed deep learning model, an L1-norm of each filter of the layer; and pruning the filters of which the L1 norms are smaller than a preset threshold from the layer.

3. The method according to claim 1, wherein the deep learning model comprises at least one of the following: a head and shoulder detection model, an object detection model, a human detection model, and a target detection model.

4. The method according to claim 3, wherein the deep learning model is a head and shoulder detection model, and the terminal device performs head and shoulder detection by the following steps:

acquiring an image of a preset region; and inputting the image to a compressed deep learning model to obtain head and shoulder detection boxes in the image.

5. An apparatus for compressing a deep learning model, comprising:

an acquisition unit, configured to acquire a to-be-compressed deep learning model;

a pruning unit, configured to prune each layer of weights of the to-be-compressed deep learning model in units of channels to obtain a compressed deep learning model; and a sending unit, send the compressed deep learning model to a terminal device, so that the terminal device stores the compressed deep learning model, wherein the pruning each layer of weights of the to-be-compressed deep learning model in units of channels comprises:

taking, for each layer of the to-be-compressed deep learning model, the layer of weights, represented by a four-dimensional array, as a first preset number of filters, the first preset number being a value of a dimension of the four-dimensional array and a filter being a three-dimensional array obtained by removing the dimension for the first preset number from the four-dimensional array; and pruning a second preset number of filters from the first preset number of filters according to an importance of each filter, wherein the second preset number is smaller than the first preset number, wherein the pruning each layer of weights of the to-be-compressed deep learning model in units of channels comprises:

first pruning, for each layer of the to-be-compressed deep learning model, convolutional weights of the layer before batch normalization, and then pruning batch normalization parameters, corresponding to the second preset number of filters, of the layer; and retraining the to-be-compressed deep learning model by using a training sample set each time a layer is pruned.

6. The apparatus according to claim 5, wherein the pruning unit is further configured to:

calculate, for each layer of the to-be-compressed deep learning model, an L1-norm of each filter of the layer; and prune the filters of which the L1 norms are smaller than a preset threshold from the layer.

7. The apparatus according claim 5, wherein the deep learning model comprises at least one of the following: a head and shoulder detection model, an object detection model, a human detection model, and a target detection model.

8. The apparatus according to claim 7, wherein the deep learning model is a head and shoulder detection model, and the terminal device performs head and shoulder detection by the following steps:

acquiring an image of a preset region; and inputting the image to a compressed deep learning model to obtain head and shoulder detection boxes in the image.

9. An electronic device, comprising:

one or more processors; and a storage apparatus storing one or more programs, wherein the one or more programs, when executed by the one or more processors, cause the one or more processors to:

acquire a to-be-compressed deep learning model;

prune each layer of weights of the to-be-compressed deep learning model in units of channels to obtain a compressed deep learning model; and send the compressed deep learning model to a terminal device, so that the terminal device stores the compressed deep learning model, wherein the pruning each layer of weights of the to-be-compressed deep learning model in units of channels comprises:

taking, for each layer of the to-be-compressed deep learning model, the layer of weights, represented by a four-dimensional array, as a first preset number of filters, the first preset number being a value of a dimension of the four-dimensional array and a filter being a three-dimensional array obtained by removing the dimension for the first preset number from the four-dimensional array; and pruning a second preset number of filters from the first preset number of filters according to an importance of each filter, wherein the second preset number is smaller than the first preset number, wherein the pruning each layer of weights of the to-be-compressed deep learning model in units of channels comprises:

first pruning, for each layer of the to-be-compressed deep learning model, convolutional weights of the layer before batch normalization, and then pruning batch normalization parameters, corresponding to the second preset number of filters, of the layer; and retraining the to-be-compressed deep learning model by using a training sample set each time a layer is pruned.

10. A non-transitory computer-readable medium, storing a computer program, wherein when the computer program is executed by a processor, to:

acquire a to-be-compressed deep learning model;

prune each layer of weights of the to-be-compressed deep learning model in units of channels to obtain a compressed deep learning model; and send the compressed deep learning model to a terminal device, so that the terminal device stores the compressed deep learning model, wherein the pruning each layer of weights of the to-be-compressed deep learning model in units of channels comprises:

taking, for each layer of the to-be-compressed deep learning model, the layer of weights, represented by a four-dimensional array, as a first preset number of filters, the first preset number being a value of a dimension of the four-dimensional array and a filter being a three-dimensional array obtained by removing the dimension for the first preset number from the four-dimensional array; and pruning a second preset number of filters from the first preset number of filters according to an importance of each filter, wherein the second preset number is smaller than the first preset number, wherein the pruning each layer of weights of the to-be-compressed deep learning model in units of channels comprises:

first pruning, for each layer of the to-be-compressed deep learning model, convolutional weights of the layer before batch normalization, and then pruning batch normalization parameters, corresponding to the second preset number of filters, of the layer; and retraining the to-be-compressed deep learning model by using a training sample set each time a layer is pruned.

11. The method according to claim 1, wherein the second preset number is 30% of the first preset number.

12. The method according to claim 2, wherein the preset threshold is 0.4.

* * * * *